US007765075B2

(12) United States Patent
Feldhaus et al.

(10) Patent No.: US 7,765,075 B2
(45) Date of Patent: Jul. 27, 2010

(54) METHOD AND DEVICE FOR SPECTRAL ANALYSIS IN SEVERAL FREQUENCY BANDS WITH DIFFERENT FREQUENCY RESOLUTION

(75) Inventors: Gregor Feldhaus, Munich (DE); Hagen Eckert, Mering (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 486 days.

(21) Appl. No.: 11/575,420

(22) PCT Filed: Sep. 16, 2005

(86) PCT No.: PCT/EP2005/010029

§ 371 (c)(1), (2), (4) Date: Aug. 1, 2007

(87) PCT Pub. No.: WO2006/034791

PCT Pub. Date: Apr. 6, 2006

(65) Prior Publication Data

US 2009/0144004 A1    Jun. 4, 2009

(30) Foreign Application Priority Data

Sep. 28, 2004 (DE) .................. 10 2004 047 044
Oct. 21, 2004 (DE) .................. 10 2004 051 386

(51) Int. Cl.
*G01R 23/16* (2006.01)
(52) U.S. Cl. .................. 702/77; 702/78; 324/76.19
(58) Field of Classification Search ............ 702/75–78; 324/76.19–76.33, 76.39–76.48
See application file for complete search history.

(56) References Cited

U.S. PATENT DOCUMENTS

| 4,307,340 A | 12/1981 | Inami et al. |
| 4,973,897 A | 11/1990 | Obsawa |
| 5,075,619 A | 12/1991 | Said |
| 5,815,580 A * | 9/1998 | Craven et al. .................. 381/58 |

FOREIGN PATENT DOCUMENTS

| EP | 0473949 A2 | 8/1991 |
| EP | 1721160 A1 | 6/2001 |
| WO | WO 04/001998 A1 | 12/2003 |

* cited by examiner

*Primary Examiner*—Manuel L Barbee
(74) *Attorney, Agent, or Firm*—Lewis, Rice & Fingersh, L.C.

(57) ABSTRACT

A method for spectral analysis of a signal ($s_1(t)$) in several frequency bands with different frequency resolution adapts the two spectra of the signal ($s_1(t)$) from adjacent frequency bands relative to one another in the transitional range of the two frequency bands. The associated device contains a unit for discrete convolution (3), which implements a smoothing of the discrete power spectra ($|\underline{S}_1(k)|^2$) of the discrete signal ($s_1(k)$) from adjacent frequency bands in the transitional range of the two frequency bands.

17 Claims, 6 Drawing Sheets

METHOD AND DEVICE FOR SPECTRAL ANALYSIS IN SEVERAL FREQUENCY BANDS WITH DIFFERENT FREQUENCY RESOLUTION

CROSS REFERENCE TO RELATED APPLICATIONS

This application is a §371 National Phase of PCT Application Serial Number PCT/EP2005/010029 which claims priority to German Patent application 10 2004 047 044.8 filed Sep. 28, 2004 and German Patent Application 10 2004 051 386.4 filed Oct. 21, 2004. The entire disclosure of all documents is herein incorporated by reference.

BACKGROUND

1. Field of the Invention

The invention relates to a method and a device for spectral analysis in several frequency bands with different frequency resolution.

2. Description of the Related Art

To determine the spectrum of a signal within a wide frequency range using a spectrum analyser or network analyser, the frequency range to be investigated is divided into several frequency bands each with a specific frequency resolution. By contrast with a technical solution with one frequency band and one frequency resolution for the entire frequency range, this achieves a significant reduction in the computational volume for determining the spectrum to be presented in a logarithmic frequency axis and also increases the range of display options for the spectrum to be analysed.

One substantial, hitherto-unresolved problem of spectral analysis in several frequency bands with different frequency resolution is the occurrence of instabilities in the transitional range between two frequency bands. These instabilities result from extremely narrow-band spectral components of the spectrum to be measured—for example, discrete spectral lines of periodic signal components in the usable signal or discrete spectral lines of sinusoidal interference—in the transitional range between two frequency bands. If this discrete spectral line, as shown in FIG. 1, occurs at the edge of the frequency band with the relatively higher frequency resolution, this discrete spectral line is identified not only by the discrete Fourier analysis producing the spectrum in the frequency band with the relatively higher frequency resolution, but also by the discrete Fourier analysis producing the spectrum in the frequency band with the relatively lower frequency resolution.

As shown in FIG. 1, the spectrum of the discrete spectral line of the sinusoidal interference signal to be presented has already decayed because of the narrow-band window function of the discrete Fourier analysis for the frequency band with the relatively higher frequency resolution at the edge of this frequency band—empty circle of the associated spectral value—, while the discrete Fourier analysis for the frequency band with the relatively lower frequency resolution already identifies the discrete spectral line of the sinusoidal interference signal disposed outside the associated frequency band because of its broader-band window function and visualises part of the spectrum of the sinusoidal interference signal to be displayed at the edge of this frequency band—filled circle of the associated spectral value.

SUMMARY

The invention is therefore based upon the object of removing instabilities in the transitional region between two frequency bands resulting from discrete spectral lines—especially a single discrete spectral line in the transitional region—for spectral analysis in several frequency bands with different frequency resolution.

The object of the invention is achieved by a method for spectral analysis of a signal and by device for spectral analysis of a signal.

The undesirable instability in the transitional region between two frequency bands is removed in the method according to the invention and in the device according to the invention by adapting the two spectra associated with the respectively-adjacent frequency bands in the transitional region by means of smoothing.

Since the two spectra are smoothed on the basis of an equidistant frequency grid, and a different frequency resolution of the discrete Fourier analysis predominates in the adjacent frequency bands, the frequency resolution of the discrete Fourier analysis between the two frequency bands must be adapted. Since a low frequency resolution cannot be retrospectively improved into a higher frequency resolution, the relatively higher frequency resolution of the discrete Fourier analysis is retrospectively reduced in the transitional range of the two frequency bands in a stepwise manner from the frequency band interior over a defined number of discrete spectral values in the direction towards the frequency band boundary without changing the frequency grid in the frequency band with the higher frequency resolution.

Instead of complex spectral values, the associated scaled power values are used in the smoothing and subsequent presentation. The smoothing of each of the power values in the overlapping range under observation takes place by weighting a given number of respectively lower-frequency and higher-frequency, adjacent power values with a weighting factor and by subsequent addition, which corresponds overall to a discrete convolution of the power values to be smoothed with a discrete weighting function.

The respective adjacent power values are weighted with an averaging filter, of which the transmission function is modulus-squared and scaled by analogy with the use of power values instead of spectral values.

To achieve a uniform transition between the frequency bands, the averaging length, within which the adjacent power values to be considered for smoothing are disposed, is altered steadily dependent upon the frequency position of the respective power value to be smoothed. Accordingly, the invention provides a corresponding adaptation of the filter length of the averaging filter.

The averaging filter associated with the power value at the frequency-band boundary to be smoothed therefore has the largest filter length and corresponds to the Fourier transform of the window function for the frequency band with the relatively lower frequency resolution and can consequently be determined from the window function by discrete Fourier transformation. The averaging filters for the power values to be smoothed with the relatively greater frequency distance relative to the frequency band boundary have a successively shorter filter length and can be determined by oversampling of the averaging filter, which is associated with the power value to be smoothed at the frequency-band boundary, and subsequent zeroing of the respective outermost spectral values of the transmission function of the averaging filter obtained through oversampling.

BRIEF DESCRIPTION OF THE DRAWINGS

One embodiment of the method and the device according to the invention for spectral analysis of a signal is explained in greater detail below with reference to the drawings. The drawings are as follows.

DETAILED DESCRIPTION OF THE PREFERRED EMBODIMENT(S)

Before describing in detail the method according to the invention and the device according to the invention for spectral analysis of a signal with reference to FIGS. 4, 5A, 5B, 5C, 5D, 5E, 6, 7, 8A, 8B, 8C and 8D, a description is provided below of the occurrence of instabilities in the transitional range between two frequency bands in each case with different combinations of effects responsible for the different frequency resolution. Against this background, the mathematical basis for understanding the method according to the invention and the device according to the invention will be explained in detail.

Figure 2:
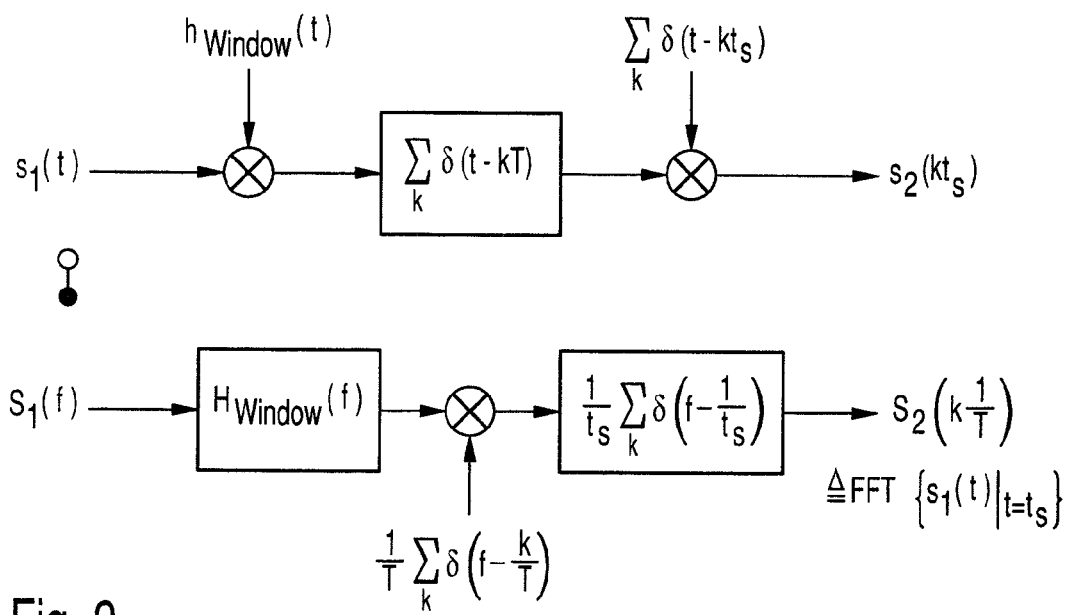
FIG. 2 shows a block circuit diagram in the time and frequency domain of a discrete Fourier analysis.

A discrete Fourier analysis, of which the function is presented with reference to a block circuit diagram in the time domain and frequency domain in FIG. 2, consists essentially of a windowing of the time signal ($s_1(t)$) to be analysed with a window function $h_{window}(t)$ of window length T, a periodic continuation of the windowed time signal with the period of the window length T and a final cyclical sampling of the windowed and periodically-continued time signal with a sampling frequency $1/t_s$.

In the frequency domain, the following corresponding frequency functions are obtained for the time functions of the discrete Fourier analysis to be implemented in the time domain:

The multiplication of the time signal ($s_1(t)$) by the window function $h_{window}(t)$ corresponds to a convolution of the Fourier transform $S_1(f)$ of the time signal $s_1(t)$ with the transmission function $H_{window}(f)$ corresponding to the window function $h_{window}(t)$. The periodic continuation of the windowed time signal over the period of the window length T by convolution with a Dirac comb of the periodicity of the window length T corresponds in the frequency domain to a multiplication of the Fourier transform of the windowed time signal by a Dirac comb with the amplitude and the periodicity of the inverse window length 1/T in each case. Finally, the sampling of the windowed and periodically-continued time signal in the time domain results in a convolution of the Fourier transform of the windowed and periodically-continued time signal with a Dirac comb with the amplitude and the periodicity of the sampling frequency $1/t_s$ in each case.

The time signal $s_2(k \cdot t_s)$ at the output of the Fourier analysis, which is derived from a windowing, periodic continuation and sampling of the time signal $s_1(t)$ at the input of the discrete Fourier analysis, corresponds in the frequency domain to the Fourier transform $S_2(k/T)$, which results from a windowing, periodic continuation and sampling of the Fourier transform $S_1(f)$ of the time signal $s_1(t)$.

The linear resolution $1/T$ of the Fourier transform $S_2(k/T)$ of the windowed, periodically-continued and sampled time signal $s_1(t)$ is directly proportional to the window length T of the window function $h_{window}(t)$. Not only the window length T, but also the form of the window function $h_{window}(t)$ are decisive for the optimisation of the linear resolution $1/T$ of the Fourier transform $S_2(k/T)$. In the frequency domain, a rectangular window function $h_{window}(t)$ with a period duration T and a symmetry to $t=0$ provides the narrowest-band main lobe and therefore the highest frequency resolution of all window functions, but, because of the $\sin(x)/x$ characteristic of its spectrum, extends over a wide frequency range and therefore often has an interfering effect in an adjacent frequency band. To avoid this interfering influence of a rectangular windowing on adjacent spectra, window functions with "softer" flanks in the time domain, such as Gaussian, Hamming, Hanning, Chebyshev and similar window functions are used.

If several frequency bands with respectively different frequency resolution are present, the relationship presented in equation (1) between the window length T of the window function $h_{window}(t)$, the FFT-length $N_{FFT}$ of the discrete Fourier analysis and of the sampling frequency $1-t_s$, with which the time signal $s_1(t)$ to be measured is sampled, is obtained for each window length T of the window function $h_{window}(t)$, with which the time signal $s_1(t)$ to be measured is windowed for the respective frequency band:

$$T = N_{FFT} \cdot t_s \quad (1)$$

According to the similarity law of the Fourier transform, there is a reciprocity between the time duration $\Delta t$ of a time signal and the bandwidth $\Delta f$ of the associated spectrum. Consequently, the correlation between the linear resolution $\Delta f$ in the respective frequency band, the FFT-length $N_{FFT}$ of the discrete Fourier analysis and the sampling frequency $1/t$, of the time signal $s_1(t)$ to be measured is obtained by inversion of equation (1):

$$\Delta f = \frac{1}{T} = \frac{1}{N_{FFT} \cdot t_s} = \frac{f_s}{N_{FFT}} \quad (2)$$

Figure 3:
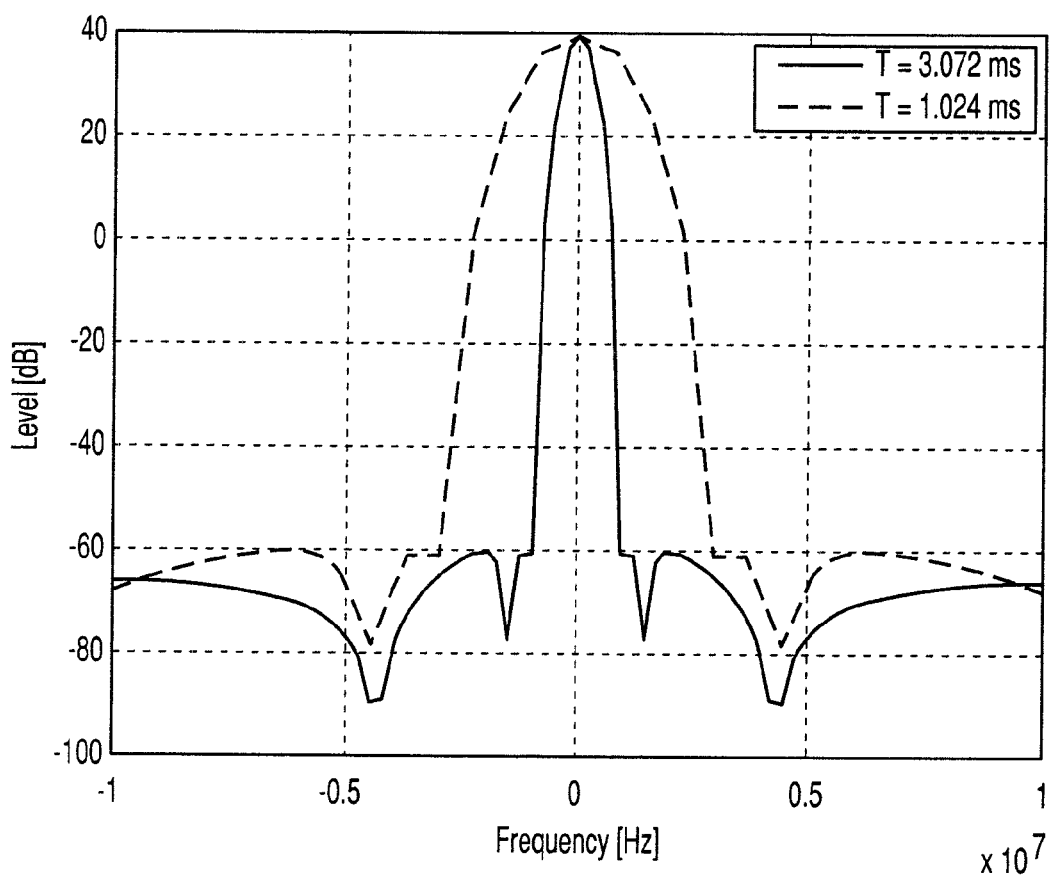
FIG. 3 shows a spectral presentation of a spectrum obtained through discrete Fourier analysis of a periodic signal component of a measurement signal with different window length.

FIG. 3 shows the transmission function of a Chebyshev window in a discrete Fourier analysis with a constant FFT length $N_{FFT}=256$ for all frequency bands for the windowing of a time signal to be presented in a frequency band II with a frequency range from 33 kHz to 100 kHz and to be sampled at a sampling rate of 250 kHz—dotted line—and for the windowing of an identical time signal to be presented in a frequency band I with a frequency range from 10 kHz to 33 kHz and to be sampled with a sampling rate of 83.3 kHz—continuous line. The window length T of the window function $h_{window}(t)$ obtained according to equation (1) is 1.024 ms for frequency band II and 3.072 ms for frequency band I. As can be seen from FIG. 3, the transmission function of the Chebyshev window in the relatively higher-frequency frequency band II has a larger bandwidth than in the lower-frequency frequency band I and therefore results in a relatively lower frequency resolution of frequency band II by comparison with frequency band I.

The multiplication of the time signal $s_1(t)$ by the window function $h_{window}(t)$ corresponds to a convolution of the Fourier transform $S_1(f)$ of the time signal $s_1(t)$ with the Fourier transform $H_{window}(f)$ of the window function $h_{window}(t)$. The discrete convolution of a discrete spectral value of the Fourier transform $S_1(k)$ with the discrete transmission function $H_{window}(k)$ of the discrete window function $h_{window}(k)$ can accordingly be interpreted as a sliding averaging over the respectively-adjacent discrete spectral values of the discrete Fourier transform $S_1(k)$ of the discrete time signal $s_1(k)$ with the respective spectral value of the discrete transmission function $H_{window}(k)$ of the discrete window function $h_{window}(k)$ as an associated weighting factor. Since the window length T of the window function $h_{window}(t)$ for relatively higher-frequency frequency bands is reduced according to equation (1) and accordingly the bandwidth of the associated transmission function $H_{window}(f)$ is increased, this leads to an increase in the averaging length of the sliding averaging in relatively higher-frequency frequency bands.

Figure 1:
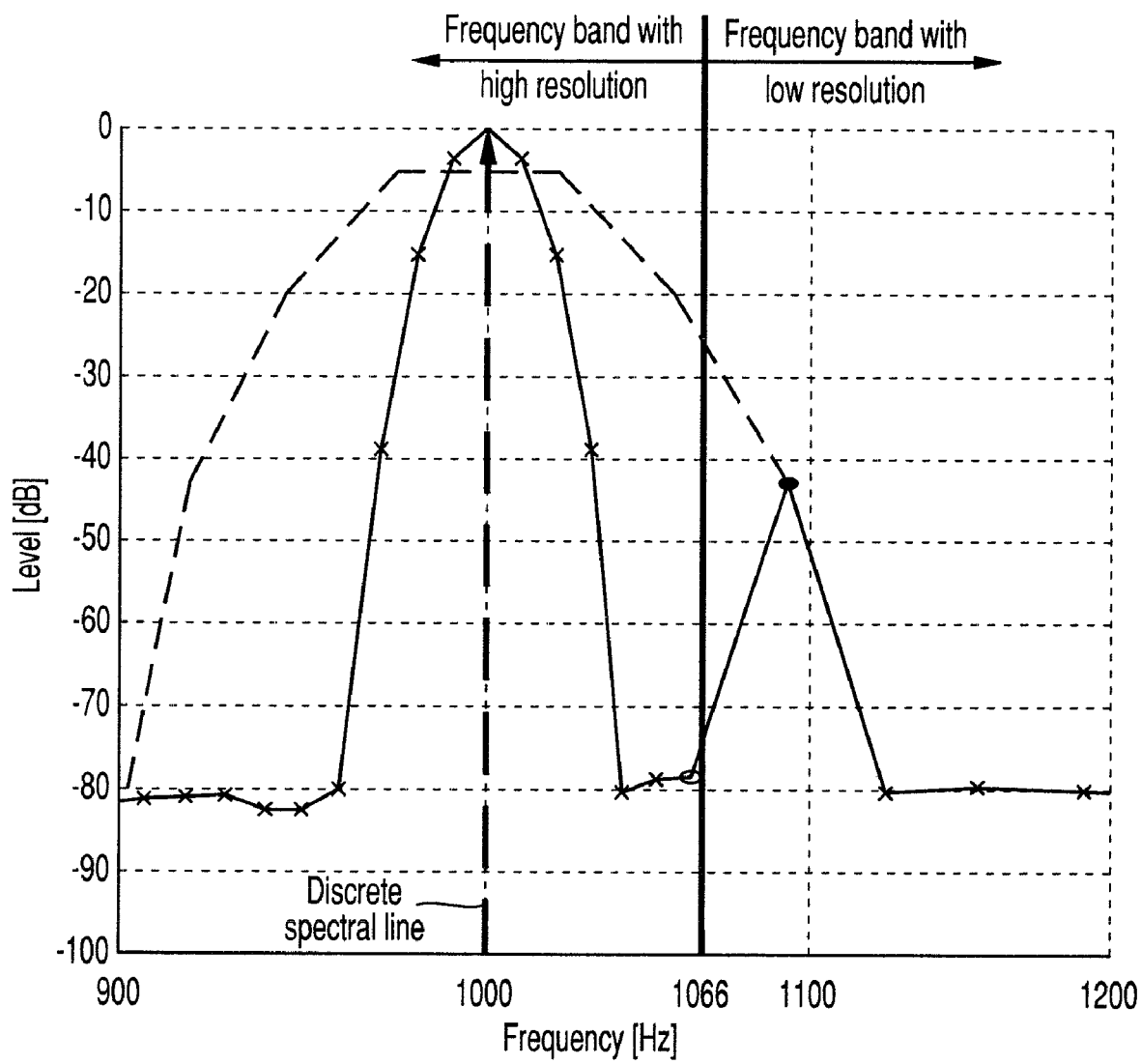
FIG. 1 shows a spectral presentation of the transitional region between two frequency bands.

In this manner, the averaging lengths in adjacent frequency bands with different frequency resolutions are different in length and therefore lead, in the event of an occurrence of a narrow-band spectral component of the spectrum to be measured—for example, a discrete spectral line in the spectrum to be measured—to a widening of this spectral line in the corresponding spectral presentation in the transitional region between the two frequency bands through the windowing of the discrete Fourier analysis. In this context, the bandwidth of the widened spectral line in the frequency band with the relatively higher frequency resolution (continuous line in FIG. 1) is significantly narrower than the bandwidth of the spectral line widened in the frequency band with the relatively lower frequency resolution. In FIG. 1, this is visualised by the continuous line for the spectral component of the widened spectral line presented in real terms in the frequency band with the relatively-lower frequency resolution and by the dotted line for the residual spectral component of the spectral line widened in the frequency band with the relatively-lower frequency resolution, which is not displayed in the frequency band with the relatively-higher frequency resolution. This leads to the instability mentioned in the introduction above in the transitional region between two frequency bands with different frequency resolution (filled and empty circle of the two adjacent power values at the boundary between the two frequency bands).

The instability occurring in the frequency spectrum of two adjacent frequency bands with respectively different frequency resolution can be remedied according to the invention by removing its cause—different frequency resolution for the two frequency bands. The idea of the invention is the stepwise adaptation of the frequency resolution in the transitional region of the two frequency bands using a sliding averaging filter within the spectral range. The averaging lengths for the sliding averaging are derived—when using a Fourier analysis for spectral estimation—from the bandwidth of the transmission function $H_{window}(f)$ associated with the window function $h_{window}(t)$. The frequency resolution is corrected retrospectively by the introduction according to the invention of a sliding averaging filter with the transmission function $H_{MA}(f)$.

Since a retrospective increase in the frequency resolution of the discrete Fourier analysis cannot be implemented in the frequency band with the relatively-lower frequency resolution, as already mentioned in the introduction above, the frequency resolution of the discrete Fourier analysis in the frequency band with the relatively-higher frequency resolution is reduced according to the invention stepwise and retrospectively over a defined number of spectral values from the interior of the frequency band in the direction towards the frequency band boundary. The original frequency grid in the frequency band with the relatively-higher frequency resolution is therefore preserved.

The change in frequency resolution of the discrete Fourier analysis in the frequency band with the relatively-higher frequency resolution takes place through filtering. At the frequency-band boundary, the frequency resolution or respectively the averaging length of the discrete Fourier analysis for the frequency band with the relatively-higher frequency resolution must agree with the frequency resolution or respectively the averaging length of the discrete Fourier analysis for the frequency band with the relatively-lower frequency resolution. Accordingly, at the frequency-band boundary, the overall transmission function of the windowing and of the downstream sliding-averaging filter, which corresponds to a convolution of the transmission function $H_{windowhR}(f)$ associated with the window function $h_{windowhR}(t)$ for the frequency band with the relatively-higher frequency resolution with the transmission function of the sliding averaging filter $H_{MA}(f)$, must, according to equation (3), agree or approximately agree with the transmission function $H_{windowlR}(f)$ associated with the window function $h_{windowlR}(t)$ for the frequency band with the relatively-lower frequency resolution.

$$H_{WindowhR}(f) * H_{MA}(f) = H_{WindowlR}(f) \quad (3)$$

The transmission function of the sliding averaging filter $H_{MA}(f)$ can, according to equation (4), be calculated by Fourier transformation of the quotient of the window function $h_{windowlR}(t)$ for the frequency band with the relatively-lower frequency resolution and the window function $h_{windowhR}(t)$ for the frequency band with the relatively-higher frequency resolution.

$$H_{MA}(f) = \mathcal{F}\left\{\frac{h_{WindowlR}(t)}{h_{WindowhR}(t)}\right\} \quad (4)$$

By way of approximation, the transmission function of the sliding averaging filter $H_{MA}(f)$ can also be obtained according to equation (5) from the transmission function $H_{windowlR}(f)$ associated with the window function $h_{windowlR}(t)$ for the frequency band with the relatively-lower frequency resolution.

$$H_{MA}(f) \approx H_{WindowlR}(f) \quad (5)$$

In practice, a discrete spectrum $H_{MA}(k)$ is used instead of a continuous spectrum $H_{MA}(f)$ of the averaging filter. This discrete spectrum $H_{MA}(k)$ of the averaging filter is calculated according to equation (6) by discrete Fourier Transformation via a Fast Fourier Transform algorithm (FFT-algorithm) from the discrete window function $h_{windowlR}(k)$ for the frequency band with the relatively-lower frequency resolution.

$$H_{MA}(k) = FFT\{h_{WindowlR}(k)\} \quad (6)$$

Regarding the design of the averaging filter, the selection of the filter length must additionally be taken into consideration. The filter length of the averaging filter, which is derived from the frequency grid and the number $2 \cdot L+1$ of discrete spectral values of the transmission function $H_{MA}(f)$ of the averaging filter, establishes the number L of spectral values to be smoothed in the overlapping region of the frequency band with the relatively-higher frequency resolution. In selecting the filter length L of the averaging filter, which should ideally be selected to be as large as possible, the following aspects, which restrict the filter length L, should be taken into consideration:

in view of the real-time processing in the calculation of the individual discrete spectral values of the averaging filter, a practicable minimisation of the filter length L of the averaging filter should be aimed for;

discrete spectral values of the averaging filter in the transitional region of the averaging filter, of which the level is lower than the maximum dynamic between the level of the discrete interference line and the level of the normally-expected noise floor, need not be taken into consideration any further in the real-time processing and therefore reduce the filter length L of the averaging filter;

in order to register from the averaging filter a constant number 2.L+1 of spectral values over the entire frequency range, in the event of an occurrence of a change in spectral-value density, the selection of the filter length L of the averaging filter should be adapted—at a frequency band boundary—to the lowest spectral-value density in the entire frequency range.

Since discrete power values $|S(k)|^2$, which are derived from a modulus-formation and squaring of the respective complex spectral values $\underline{S}(k)$, are conventionally used for the presentation of the spectrum $S(f)$ of a discrete time function $s(t)$ to be measured instead of discrete complex spectral values $\underline{S}(k)$, the discrete transmission function $H_{MA}(k)$ of the averaging filter, must also be supplied by analogy with a modulus formation and squaring. The transmission function $P_{MA}(k)$, modulus-squared according to equation (7), is additionally scaled so that the scaling condition in equation (8) is fulfilled.

$$P_{MA}(k) = |H_{MA}(k)|^2 \tag{7}$$

$$\sum_{k=-L}^{+L} P_{MA}(k) = 1 \tag{8}$$

The scaling condition in equation (8) means that the averaging has no effect on the noise power because of its equal distribution over the entire measured frequency range, while at the same time, because of its singular distribution within the entire measured frequency range, the power value associated with the discrete interference line is influenced by the averaging in a targeted manner in the ratio of the frequency resolution in the two adjacent frequency bands.

The modulus-squared and scaled transmission function $P_{MA}(k)$ of the averaging filter according to equation (9) is consequently derived from equation (7) taking into consideration the scaling condition in equation (8).

$$P_{MA}(k) = \frac{|H_{MA}(k)|^2}{\sum_{k=-L}^{+L} |H_{MA}(k)|^2} \tag{9}$$

The smoothing of the $n^{th}$ power value in the transitional range of the frequency band with the relatively-higher frequency resolution by means of sliding averaging results from the weighting of the $n^{th}$ power value and its relatively lower-frequency, adjacent power values up to L and its relatively higher-frequency, adjacent power values up to L with the spectral value associated respectively with the frequency of the modulus-squared and scaled averaging filter $P_{MA}(k)$ as a weighting factor and subsequent addition according to equation (10):

$$|\overline{S}(n)| = \sum_{k=-L}^{+L} |\overline{S}(n-k)|^2 \cdot P_{MA}(k) = |S(n)|^2 * P_{MA}(n) \tag{10}$$

for $n = 0, -1, \ldots, -L+1$

It is evident from equation (10) that the smoothing of the $n^{th}$ value by means of sliding averaging corresponds to a convolution of the $n^{th}$ value with the transmission function $P_{MA}(n)$ of the modulus-squared and scaled averaging filter, and therefore corresponds to the convolution of the Fourier transform $S(k)$ associated with the time signal $s(k)$ to be measured with the transmission function $H_{window}(k)$ associated with the window function $h_{window}(k)$.

The mathematical relationship in equation (10) for the smoothing of the $n^{th}$ power value presupposes a distribution of the individual power values of the power spectrum in an equidistant frequency grid. Since this is not provided, especially in the transitional region between two frequency bands with different frequency resolution, the frequency grid of the frequency band with the relatively-higher frequency resolution is used in the description below for smoothing the power values in the transitional range. According to FIG. 4, the frequency grid of the frequency index 1 is therefore used for smoothing the power values in the entire transitional range.

It is established by definition that the modulus-squared and scaled transmission function $P_{MA0}(k)$ of the averaging filter approximately corresponds to the smoothing of the power value at the frequency-band boundary of the transmission function $H_{windowlR}(k)$ associated with the window function $h_{windowlR}(k)$ for the frequency band with the relatively-lower frequency resolution according to equation (5).

The modulus-squared and scaled transmission function $P_{MA0}(k)$ of the averaging filter for smoothing the power value at the frequency-band boundary is therefore determined according to equation (6) by discrete Fourier transformation of the discrete window function $h_{windowlR}(k)$ for the frequency band with the relatively-lower frequency resolution and subsequent modulus-squaring and scaling according to equation (9). An example of the modulus-squared transmission function $|H_{windowlR}(f)|^2$ of the window function $h_{windowlR}(t)$ for the frequency band with the relatively-lower frequency resolution with its frequency grid $\Delta f_{lR}$ is presented in FIG. 5A as the starting point for the calculation of the modulus-squared and scaled transmission function $P_{MA0}(k)$ of the averaging filter for smoothing the power value at the frequency-band boundary.

In order to smooth the power values in the transitional range, instead of an averaging filter with a constant number of filter coefficients in the transmission function $P_{MA}(k)$, the number of filter coefficients of the modulus-squared and scaled transmission function $P_{MAn}(k)$ of the associated averaging filter is reduced with an increasing frequency distance of the power value from the frequency-band boundary. According to FIGS. 5B, 5C, 5D and 5E, the filter length of the averaging filter is reduced in a stepwise manner by the two respectively outermost filter coefficients with an increasing distance of the power value to be smoothed from the frequency-band boundary. This guarantees that power values outside the transitional range—power values below L—are never filtered by one of the averaging filters. FIGS. 5B, 5C, 5D and 5E illustrate the frequency resolution $\Delta f_{hR}$, increased by comparison with the modulus-squared transmission function $|H_{windowlR}(f)|^2$ of the window function $h_{windowlR}(t)$ for the frequency band with the relatively-lower frequency resolution.

According to equation (12), the respective modulus-squared and scaled discrete transmission functions $P_{MA}(n \cdot \Delta f_{hR})$ are therefore calculated from the discrete transmission functions $H_{MAn}(n \cdot \Delta f_{hR})$ of the total of L averaging filters obtained by oversampling from the discrete transmission functions $H_{mA0}(n \cdot \Delta f_{hR})$ of the averaging filter at the frequency-band boundary.

$$P_{MAn}(n \cdot \Delta f_{hR}) = \frac{|H_{MAn}(n \cdot \Delta f_{hR})|^2}{\sum_{k=-L}^{+L} |H_{MAn}(n \cdot \Delta f_{hR})|^2} \quad \text{for } n = -L, \ldots, +L \quad (12)$$

Starting from equation (10) and taking into consideration the modulus-squared and scaled transmission functions $P_{MAn}(k=n \cdot \Delta f_{hR})$ of the respective nth averaging filter, the smoothed $n^{th}$ power value $|\overline{S}(n)|$ can be calculated according to equation (13).

$$|\overline{S}(n)| = \sum_{k=-L}^{+L} |\underline{S}(n-k)|^2 \cdot P_{MAn}(k) = |\underline{S}(n)|^2 * P_{MAn}(n) \quad (13)$$

for $n = 0, -1, \ldots, -L+1$

Figure 6:
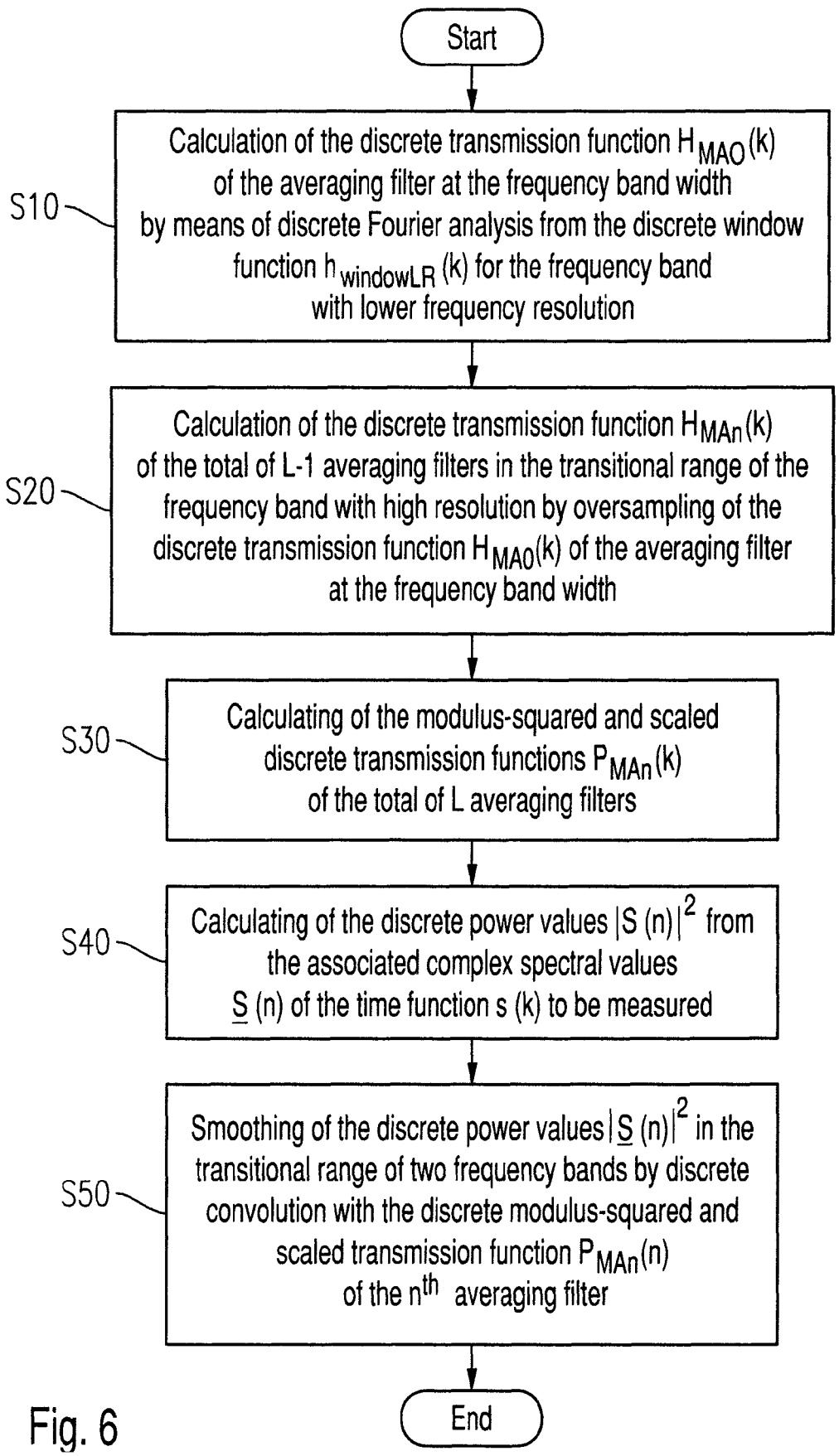
FIG. 6 shows a flow chart of a method according to the invention for spectral analysis of signal.

On the basis of the mathematical background derived in this manner, the method according to the invention for removing instabilities within a spectral analysis in the transitional region between two frequency bands of different frequency resolution is described below with reference to FIG. 6.

In procedural stage S10, the associated discrete transmission function $H_{windowlR}(k)$, which is used for the discrete transmission function $H_{MA0}(k)$ of the $0^{th}$ averaging filter at the frequency-band boundary between the two frequency bands with respectively different frequency resolution, is calculated according to equation (6) by discrete Fourier analysis of the discrete window function $h_{windowlR}(k)$, which implements the windowing for the frequency band with the relatively-lower frequency resolution.

In the next procedural stage S20, the discrete transmission functions $H_{MAn}(k)$ of the remaining total of L−1 averaging filters in the transitional range of the frequency band with the relatively-higher frequency resolution are calculated. For this purpose, at the frequency-band boundary, the discrete transmission function $H_{MA0}(k)$ of the $0^{th}$ averaging filter is used, which is transferred by oversampling by the factor $$\Delta \Delta f = \frac{\Delta f_{lR}}{\Delta f_{hR}}$$

and stepwise reduction of the filter length into a discrete transmission function $H_{MAn}(k)$ of the respective averaging filter with a respectively-reduced number of filter coefficients.

If the frequency axis is plotted logarithmically, the spectral values or respectively power values are disposed closer together at the upper edge of a semi-decade than at the lower edge of a semi-decade. This increase in the frequency distance of the individual spectral values and power values in the case of a logarithmic frequency axis in the direction towards the lower edge of the semi-decade is compensated by the higher amplitude values of the averaging filter with a larger distance from the frequency-band boundary.

In the following procedural stage S30, the modulus-squared and scaled discrete transmission functions $P_{MAn}(k)$ of the total of L averaging filters are calculated according to equation (12) by modulus-formation and scaling from the discrete spectral values $H_{MAn}(k)$ determined in procedural stage S20 for all of the total of L averaging filters in the transitional range of the frequency band with the relatively-higher frequency resolution.

While the previous procedural stages S10 to S30 are calculated offline or also online in the presence of high-power signal-processing hardware, the implementation of the subsequent procedural stages S40 to S50 always takes place online.

In procedural stage S40, the associated discrete power values $|\underline{S}(n)|^2$ are calculated by means of modulus-squaring from the discrete complex spectral values $\underline{S}(n)$, which are obtained by means of discrete Fourier analysis from the sampled time function $s(k)$ to be measured.

In the final procedural stage S50, the total of L smoothed power values $|\underline{S}(n)|^2$ within the transitional range of the frequency band with the relatively higher frequency resolution is calculated by means of discrete convolution with the respective discrete modulus-squared and scaled transmission function $P_{MAn}(n)$ of the $n^{th}$ averaging filter according to equation (13).

Figure 7:
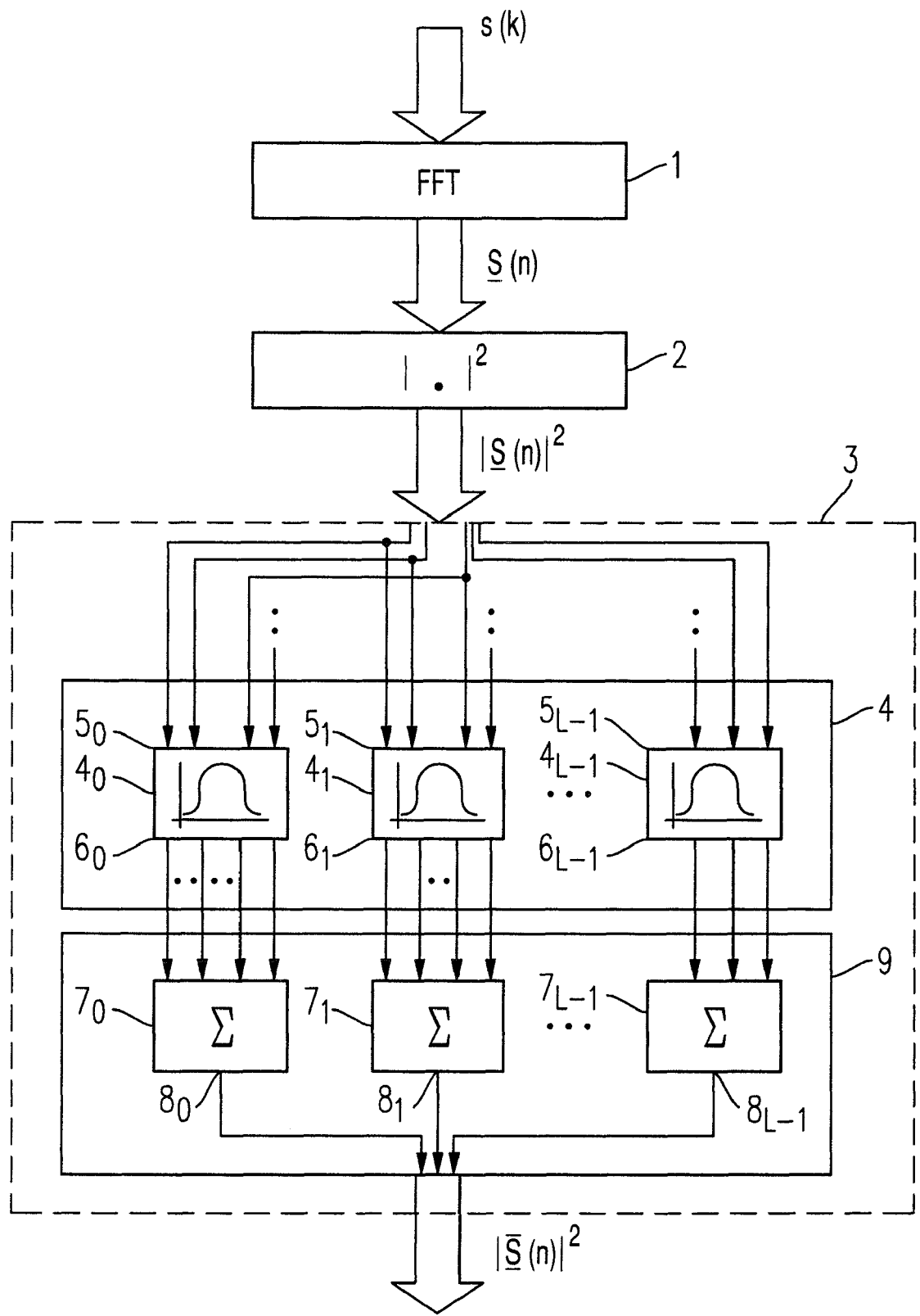
FIG. 7 shows a block circuit diagram of a device according to the invention for spectral analysis of a signal.
Figure 8A:
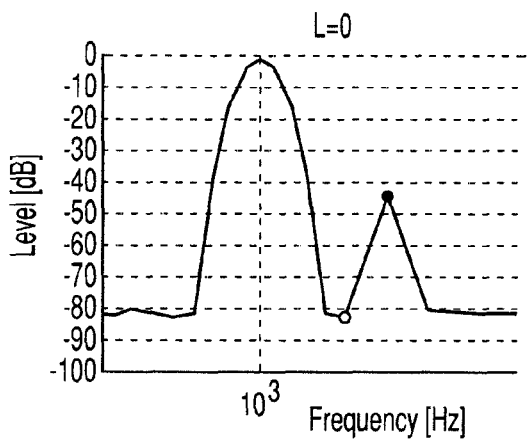
FIGS. 8A, 8B, 8C, 8D show a spectral presentation of the transitional region between two frequency bands after smoothing according to the invention of a different number of power values.
Figure 8B:
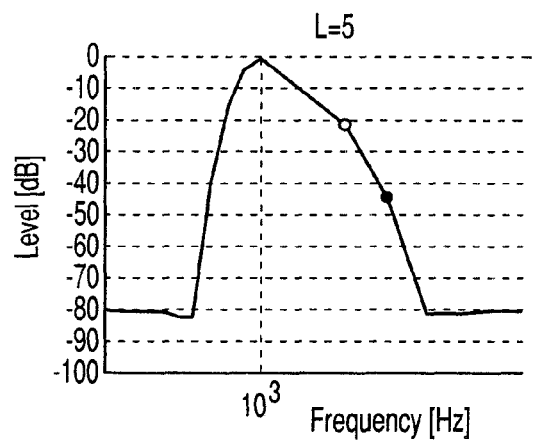
Figure 8C:
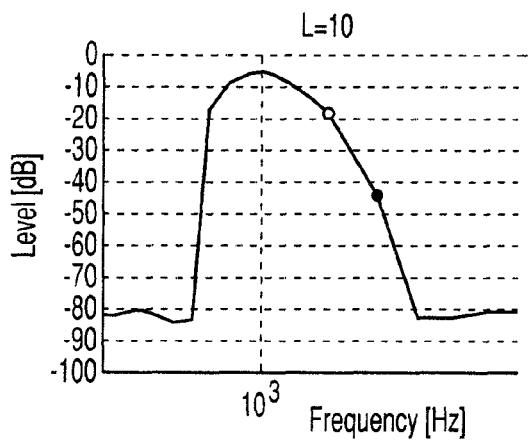
Figure 8D:
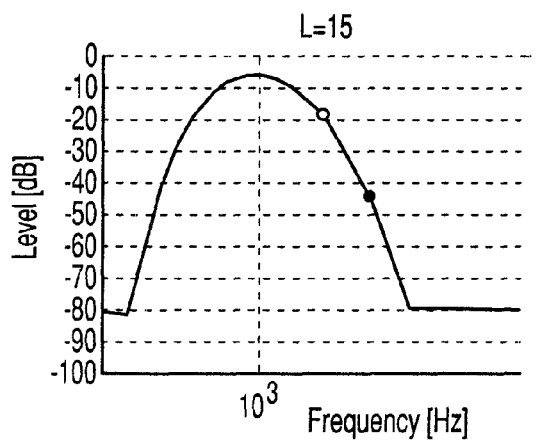

The associated device according to the invention for the removal of instabilities in the transitional range of adjacent frequency bands of different frequency resolution in a spectral analysis according to FIG. 7 consists essentially of a unit for the implementation of the discrete Fourier analysis 1, which calculates the complex spectral values $\underline{S}(n)$ of the associated Fourier transform from the sampled time signal $s(k)$ to be measured. In a subsequent unit for modulus-squaring 2, the associated power values $|\underline{S}(n)|^2$ are determined from the complex spectral values $\underline{S}(n)$ by modulus squaring and averaging.

Smoothed power values $|\underline{S}(n)|^2$ are determined in the unit for discrete convolution 3 from the power values $|\underline{S}(n)|^2$ of the Fourier transform of the sampled time signal $s(k)$. For this purpose, the unit for discrete convolution 3 consists of a unit 4 for weighting the individual power values $|\underline{S}(n)|^2$, which, in turn, is composed of a total of L averaging filters ($4_0, \ldots, 4_n, \ldots, 4_{L-1}$).

The averaging filter $4_0$ with the transmission function $H_{MA0}(k)$ is used to smooth the power value $|\underline{S}(n=0)|^2$ at the frequency-band boundary and is supplied at its input $5_0$ with the power value $|\underline{S}(n=0)|^2$ at the frequency-band boundary and its total of L low-frequency, adjacent power values and its total of L relatively high-frequency adjacent power values $|\underline{S}(-L\leq n\leq +L)|^2$. Similarly, the averaging filters $4_1$ to $4_{L-1}$ with their respective transmission functions $H_{MA1}(k)$ to $H_{MA(L-1)}(k)$ are used for smoothing the power values $|\underline{S}(n=-1)|^2$ to $|\underline{S}(n=-L+1)|^2$ and are supplied at their inputs $5_1$ to $5_{L-1}$ with the respective power values $|\underline{S}(n=-1)|^2$ to $|\underline{S}(n=-L+1)|^2$ and the respective low-frequency adjacent power values up to L and relatively high-frequency adjacent power values up to L, $|\underline{S}(-L\leq k\leq +L-2)|^2$ to $|\underline{S}(-L\leq k\leq -L+2)|^2$.

Figure 4:
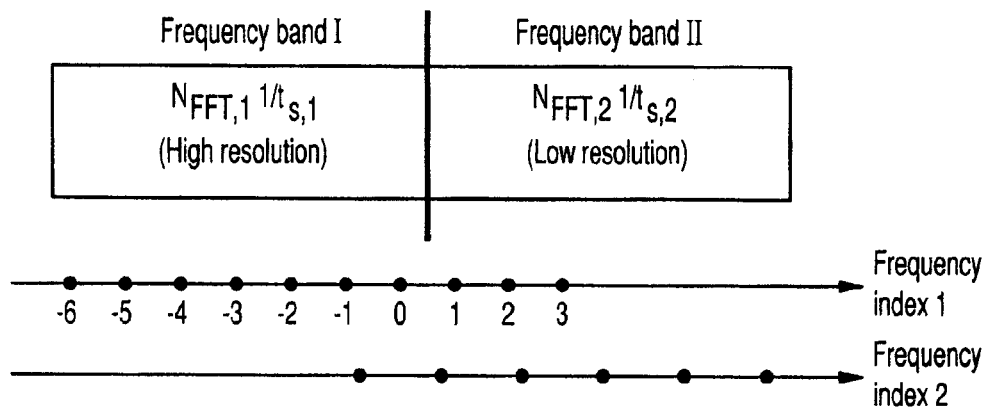
FIG. 4 shows a presentation of the frequency grid of two adjacent frequency bands.
Figure 5A:
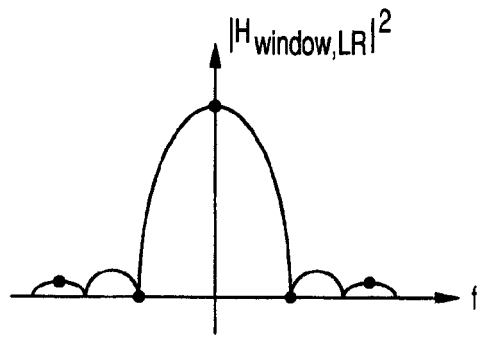
FIGS. 5A, 5B, 5C, 5D, 5E show a spectral presentation of the modulus-squared transmission function of the window function for the relatively higher-frequency frequency band and for averaging filters of different filter lengths.
Figure 5B:
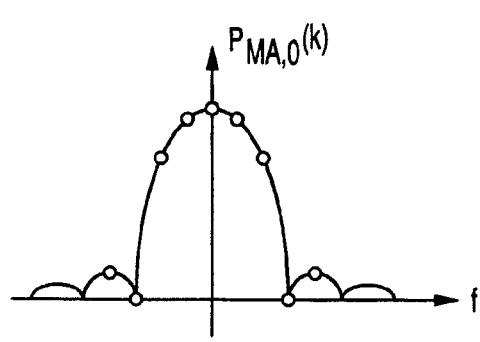
Figure 5C:
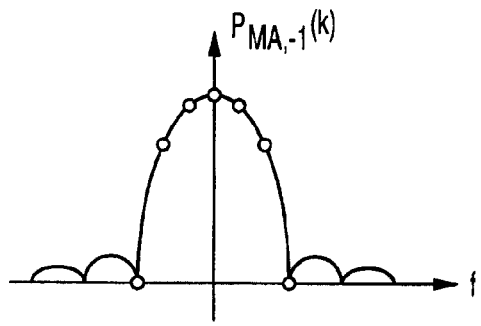
Figure 5D:
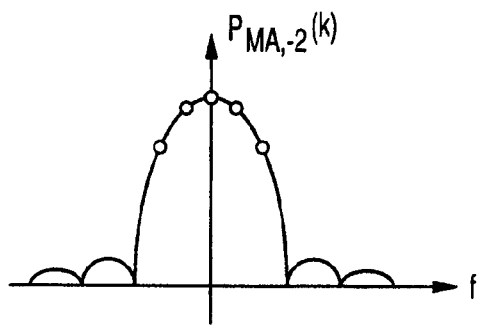
Figure 5E:
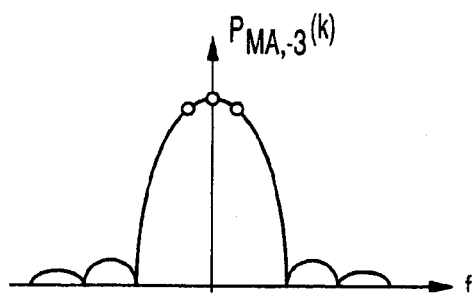

The bundles disposed at the outputs ($6_0, \ldots, 6_n, \ldots, 6_{L-1}$) of the individual averaging filters $4_0$ to $4_{L-1}$ of maximum adjacent, weighted power values $|\underline{S}(-L\leq k\leq 2n+L)|^2$ associated with the power value $|\underline{S}(n)|^2$ to be smoothed are supplied respectively to the summation elements $7_0, \ldots, 7_1, \ldots, 7_{L-1}$ of the summation unit 9. The smoothed power values $|\underline{S}(-L+1<=n<=0)|^2$, which have occurred respectively through summation of the maximum, adjacent, weighted power values $|\underline{S}(-L<=k<=2n+L)|^2$ associated with the power value $|\underline{S}(n)|^2$ to be smoothed in the individual summation elements $7_0, \ldots, 7_1, \ldots, 7_{L-1}$), are disposed at the outputs $8_0, \ldots, 8_1, \ldots, 8_{L-1}$ of the summation elements $7_0, \ldots, 7_1, \ldots, 7_{L-1}$), Other spectral estimation methods, such as the sweep mode of spectrum analyser, can be used instead of a Fast Fourier Transform (FFT). The discrete interpolation points shown in FIG. 4 are then derived by discrete sampling of the spectrum determined. The frequency resolution of the spectrum in this case is not determined by the Fourier Transform $H_{window}(f)$ of the window function $h_{window}(t)$ of an FFT, but through the transmission function $H_{RBW}(f)$ of the resolution filter used within the frequency range. In this case, the filter calculations in the method according to the invention take place by analogy with the case described, wherein $H_{window}(f)$ is replaced by $H_{RBW}(f)$.

The result of the method according to the invention and the device according to the invention for the removal of instabilities in the transitional range of frequency bands of different frequency resolution in a spectral analysis are presented in FIGS. 8A, 8B, 8C and 8D. In this context, the respective transitional range between two frequency bands of different frequency resolution, of which the boundary is disposed between the power value with the empty circle and the filled circle, is presented, in the case of a sinusoidal discrete interference at 1000 Hz, with an averaging length and therefore a filter length L of 0, 5, 10 and 15. While, in the completely un-smoothed case—L=0 in FIG. 8A—, the instability in the transitional range of the frequency-band boundary is clearly recognisable, this instability is increasingly smoothed with an increasing averaging length or respectively filter length L. In the case of optimum smoothing with an averaging length or respectively filter length L=15 in FIG. 8D, the instability in the transitional range of the frequency bands with different frequency resolution has been completely removed.

The invention is not restricted to the embodiment presented. In particular the invention also covers the application, wherein the relatively higher semi-decade provides a greater resolution than the relatively lower semi-decade. In this application, the smoothing of the power values must take place stepwise from the relatively higher to the relatively lower frequency by increasing the filter length of the respective averaging filter.

Applications, in which other spectral estimation methods or measuring methods, such as the sweep mode of a spectrum analyser, are used instead of a discrete Fourier Transform; or in which the spectrum of mutually-adjacent frequency bands is measured with different measuring methods; or in which different types of resolution filter, such as analog and digital filters are used; or in which different window functions, such as Gaussian and Hamming windows are used, are also covered.

The invention claimed is:

1. A method for spectral analysis of a signal in several frequency bands with different frequency resolution; the method comprising
   providing a signal having a plurality of frequency bands, each of said plurality of frequency bands having a different resolution;
   adapting spectra of two adjacent frequency bands of said signal to one another in the transitional range of said two adjacent frequency bands; and
   smoothing, at a unit for discrete convolution, a power spectra of the signal of adjacent frequency bands in the transitional range of the two adjacent frequency bands by the addition of a given number of low-frequency and relatively higher-frequency power values adjacent to the respective power value to be smoothed, which are filtered with an averaging filter associated with the respective power value to be smoothed.

2. The method of claim 1 wherein said spectra from two adjacent frequency bands are adapted by smoothing over a given number of discrete, complex spectral values in the transitional range of the frequency band with the relatively-higher frequency resolution.

3. The method of claim 2 wherein associated power values are used for smoothing said discrete, complex spectral values.

4. The method of claim 3 wherein a number, dependent upon a power value to be smoothed, of low-frequency and relatively higher-frequency adjacent power values, is used for smoothing each of said power values.

5. The method of claim 4 wherein said number of low-frequency and said relatively higher-frequency adjacent power values required for smoothing said power value at the boundary of two frequency bands corresponds to the number of discrete, complex spectral values to be smoothed in said transitional range of the frequency band with the relatively-higher frequency resolution.

6. The method of claim 4 wherein the number of low-frequency and relatively higher-frequency adjacent power values required for smoothing the power values is decremented respectively by 2 as the distance of the power value to be smoothed increases relative to the boundary of the two frequency bands.

7. The method of claim 3 wherein each of the power values is smoothed by discrete convolution of the respective power value with an associated averaging filter.

8. The method of claim 7 wherein the convolution of the respective power value with its associated averaging filter takes place by filtering a given number of low-frequency and relatively higher-frequency adjacent power values with the averaging filter associated with the respective power value and subsequent addition.

9. The method of claim 7 wherein the discrete convolution of the respective power value takes place with the scaled, squared modulus of the discrete spectrum of the averaging filter associated with the respective power value.

10. The method of claim 9 wherein the spectrum of the respective averaging filter, with which the power value disposed at the boundary of the two frequency bands is discretely convoluted, results from a discrete Fourier transform of the discrete window function for the implementation of a windowing of the discrete signal for the frequency band with the lower frequency resolution.

11. The method of claim 9 wherein as the frequency distance of the power values to be smoothed increases relative to the boundary of the two frequency bands, the modulus-squared and scaled spectrum of the associated averaging filter is obtained by oversampling of the spectrum of the averaging filter, with which the power value disposed at the boundary of the two frequency bands is discretely convoluted, and by subsequent zeroing of the respective outermost spectral values of the spectrum.

12. A device for spectral analysis of a signal in several frequency bands with different frequency resolution, the device comprising:
   a unit for implementation of discrete Fourier analysis;
   a unit for power formation by modulus-squaring; and a unit for discrete convolution which implements a smoothing of the power spectra of the signal of adjacent frequency bands in the transitional range of the two frequency bands said unit for discrete convolution including a summation unit for the addition of a given number of low-frequency and relatively higher-frequency power values adjacent to the respective power value to be smoothed, which are filtered with the averaging filter associated with the respective power value to be smoothed.

13. The device of claim 12 wherein said unit for power formation by modulus-squaring is connected upstream of said unit for discrete convolution, which determines, from the individual discrete spectral values the frequency band with relatively-higher frequency resolution, the associated power values, which are disposed in the overlapping range of the two frequency bands.

14. The device of claim 12 wherein said unit for discrete convolution contains an averaging filter for each respective power value to be smoothed.

15. The device of claim 14 wherein the spectrum with the respective averaging filter is additionally modulus-squared and scaled.

16. The device of claim 14 wherein the filter length of the associated averaging filter is reduced as the frequency distance of the power value to be smoothed increases relative to the boundary of the two frequency bands.

17. The device of claim 16 wherein the spectrum of the averaging filter, which is to filter the power value to be smoothed disposed at the boundary of the two frequency bands, corresponds to the Fourier transform of the window function for windowing the discrete signal for the frequency band with the relatively-lower frequency resolution.

* * * * *